United States Patent

Eul et al.

[11] Patent Number: 5,564,080
[45] Date of Patent: Oct. 8, 1996

[54] METHOD FOR OPTIMIZING THE AUTOMATIC AMPLIFIER SETTING IN RADIO RECEIVERS

[75] Inventors: Hermann-Josef Eul, Oberschleissheim; Norbert Metzner, Treuchtlingen, both of Germany

[73] Assignee: Siemens Aktiengesellschaft, Munich, Germany

[21] Appl. No.: 265,444

[22] Filed: Jun. 24, 1994

[30] Foreign Application Priority Data

Jun. 25, 1993 [DE] Germany ............... 43 21 210.7

[51] Int. Cl.⁶ .................................... H04B 1/00
[52] U.S. Cl. ........................... 455/69; 455/54.1
[58] Field of Search ................ 455/54.1, 54.2, 455/69, 70, 234.1, 250.1, 245.1

[56] References Cited

U.S. PATENT DOCUMENTS

| | | | |
|---|---|---|---|
| 4,613,990 | 9/1986 | Halpern | 455/69 |
| 5,257,283 | 10/1993 | Gilhousen et al. | 455/69 |
| 5,267,262 | 11/1993 | Wheatley, III | 455/54.1 |
| 5,278,992 | 1/1994 | Su et al. | 455/69 |
| 5,297,161 | 3/1994 | Ling | 455/69 |
| 5,305,468 | 4/1994 | Bruckert et al. | 455/69 |
| 5,313,658 | 5/1994 | Nakamura | 455/69 |
| 5,345,598 | 9/1994 | Dent | 455/69 |
| 5,386,388 | 1/1995 | Yasuda | 455/69 |
| 5,392,459 | 2/1995 | Baba et al. | 455/69 |
| 5,450,616 | 9/1995 | Rom | 455/69 |

FOREIGN PATENT DOCUMENTS

| | | |
|---|---|---|
| 0372759 | 6/1990 | European Pat. Off. . |
| 0462782 | 12/1991 | European Pat. Off. . |
| 0515335 | 11/1992 | European Pat. Off. . |
| 3805457 | 8/1989 | Germany . |
| 4001810 | 7/1991 | Germany . |
| 4017234 | 12/1991 | Germany . |
| 4141398 | 6/1993 | Germany . |

Primary Examiner—Reinhard J. Eisenzopf
Assistant Examiner—Marsha D. Banks-Harold
Attorney, Agent, or Firm—Hill, Steadman & Simpson

[57] ABSTRACT

In a method for optimizing the automatic amplifier setting in radio receivers in which information available in a radio station is utilized in a new manner. A prediction about the behavior of the reception power is to be undertaken in the reception station. To this end, the transmission power control of one station and of the variations to be anticipated as a result thereof are involved in the prediction of the anticipated reception power of the other station. This ensues in such a way that a prediction based on knowledge of the transmission power control data is supplied to the automatic gain control (AGC) of the receiver.

13 Claims, 3 Drawing Sheets

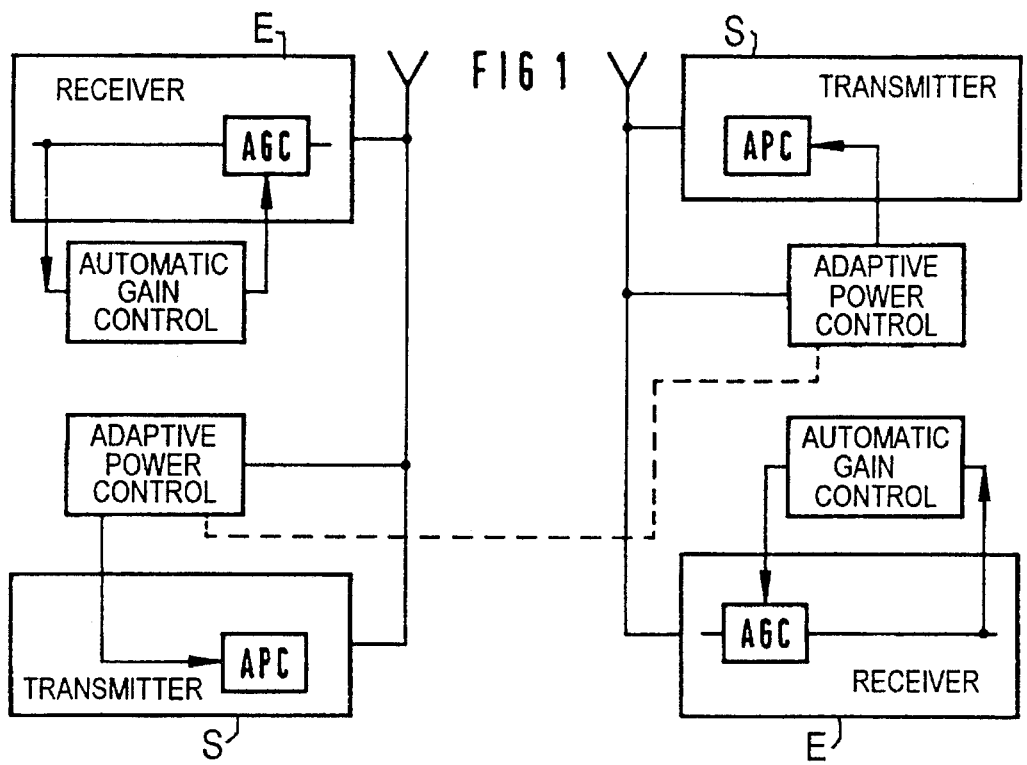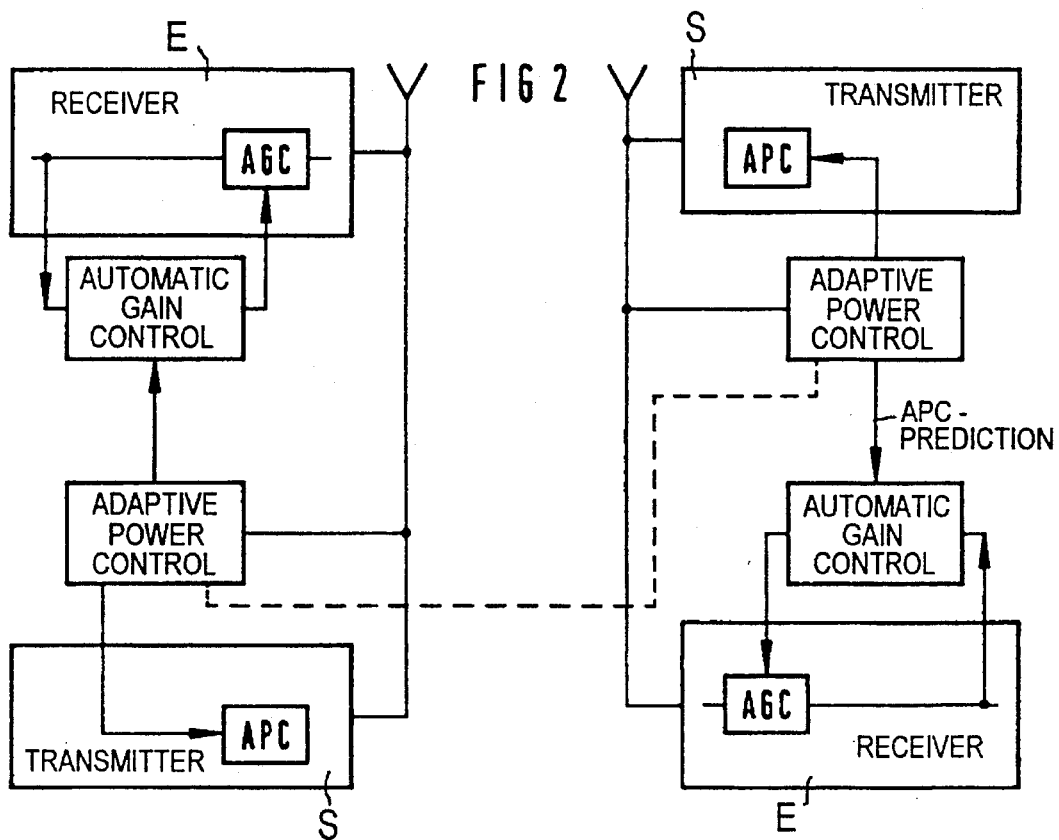

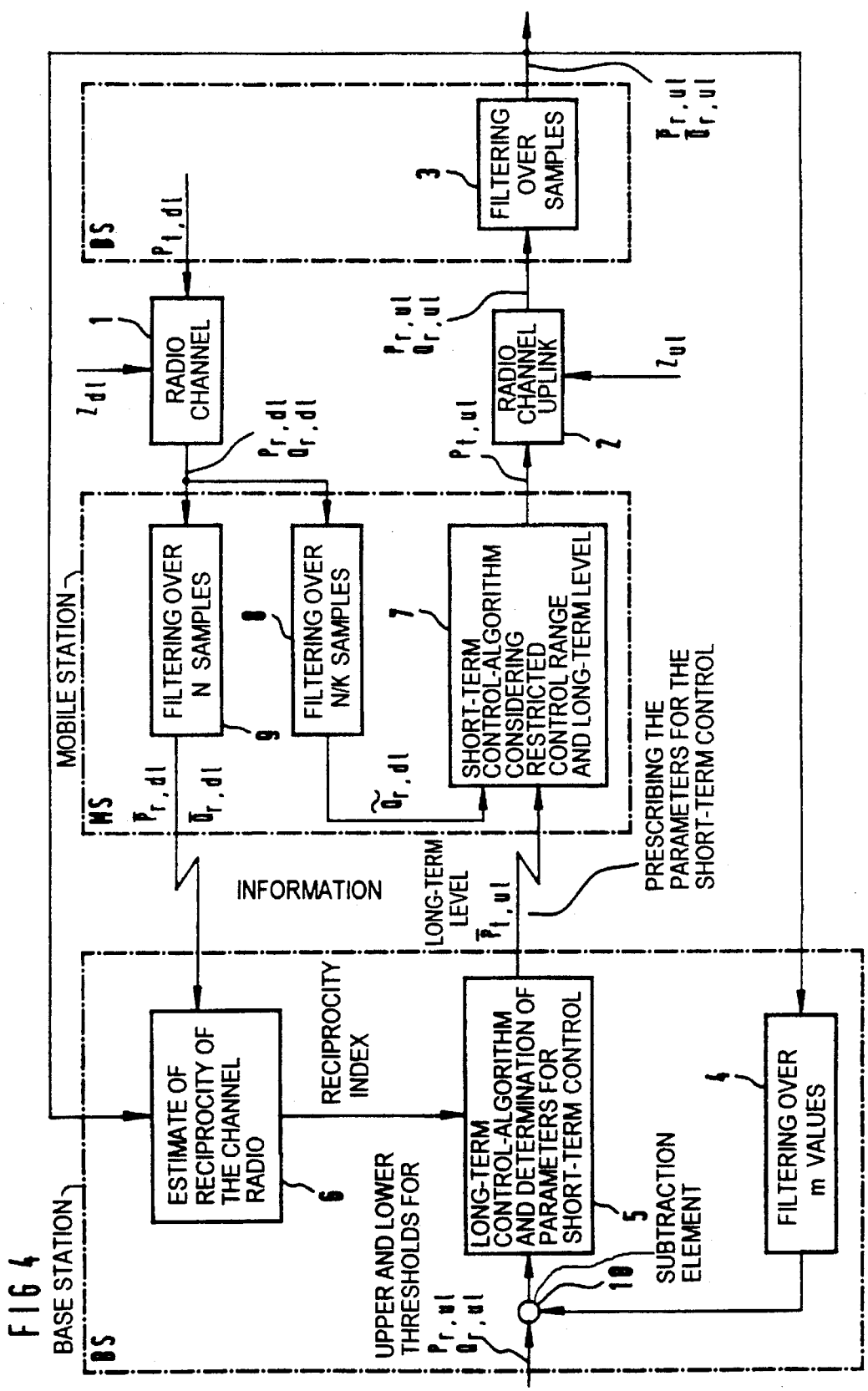

5,564,080

1

METHOD FOR OPTIMIZING THE AUTOMATIC AMPLIFIER SETTING IN RADIO RECEIVERS

BACKGROUND OF THE INVENTION

The present invention is directed to a method for optimizing an automatic amplifier setting in radio receivers, particularly mobile radio receivers in a cellular mobile radio telephone network having base stations in a mutual spatial arrangement.

In traditional radio-frequency receivers, amplifiers having one or more variable amplifier stages, known as Automatic Gain Control (AGC) are realized for compensating chronologically fluctuating received powers.

A severe problem of fluctuating received power occurs in the field of mobile radio telephone services. Moreover, transmission power regulating is utilized in mobile radio telephone services for efficiently maintaining the transmission quality. The convergence of these facts makes the design of the automatic gain control extraordinarily difficult. The additional active variation of the transmission power added to the fluctuating transmission power leads to a situation that can only be very conditionally governed by the receiver.

Traditional AGC loops employ only past reception levels for defining future AGC values. For example, the AGC is set to an average value of the reception level of the last measurement interval, for example in the last second. The block circuit diagram of FIG. 1 shows such an arrangement wherein two radio communication stations communicating with one another experience chronologically changing transmission losses. Every radio communication station contains a receiver E having an automatic gain control AGC and a transmitter S having an adaptive power control APC. There is a logical linkage (entered in broken lines) between the two APC controls.

Remaining fluctuations must be covered by an adequately liberal design of the range of dynamics of the reception stages. Given currently standard digital receivers, this means that the analog-to-digital converter must be designed with an adequately large word width in order, on the one hand, to reliably avoid over modulation and, on the other hand, to still assure adequately good resolution of the signal.

SUMMARY OF THE INVENTION

It is an object of the present invention to provide a method for predicting the behavior of the reception power in the reception station.

This object is inventively achieved with a method of the type initially cited by involving the transmission power control of a first station and the modifications to be anticipated as a result thereof in the prediction of the anticipated received power of a second station, such that a prediction is supplied to the automatic gain control (AGC) of the receiver based on a knowledge of the transmission power control data.

Advantageous developments of the present invention are as follows.

Information from the transmission power control of the second station are reused by the first station for predicting the anticipated reception power of the first station.

The prediction of the anticipated reception power ensues from mutual knowledge of data for the control of its own transmission power as well as for the control of the transmission power with respect to the allocated corresponding station (mobile station in the uplink or, respectively, base station in the downlink).

The prediction of the anticipated reception power ensues from knowledge of data that is acquired or, respectively, calculated for the control of the station's own transmission power or of the respectively allocated corresponding station.

The data for controlling the transmission power is acquired from one level of a hierarchic system composed of two levels. It is required that the control of the long-term transmission power of the mobile station ensues in the base station (long-term control) in an upper level that forms a closed control loop covering a base station and a mobile station. Additionally, it is required that a statement about the decision authorization of a lower level is made in the base station and is communicated to the mobile station. The short-term transmission power of the mobile station is calculated (short-term control) in the lower level which represents a local control implemented in the mobile station, taking into consideration the long-term transmission power calculated by the base station and the statement about the decision authorization of the lower level.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 is a schematic illustration depicting communication between two prior art radios;

FIG. 2 is a schematic illustration similar to FIG. 1 showing a predictor solution of the present invention;

FIG. 4 depicts a mobile radio telephone system having transmission power control of a mobile station shown in a block circuit diagram.

DESCRIPTION OF THE PREFERRED EMBODIMENT

Figure 3:
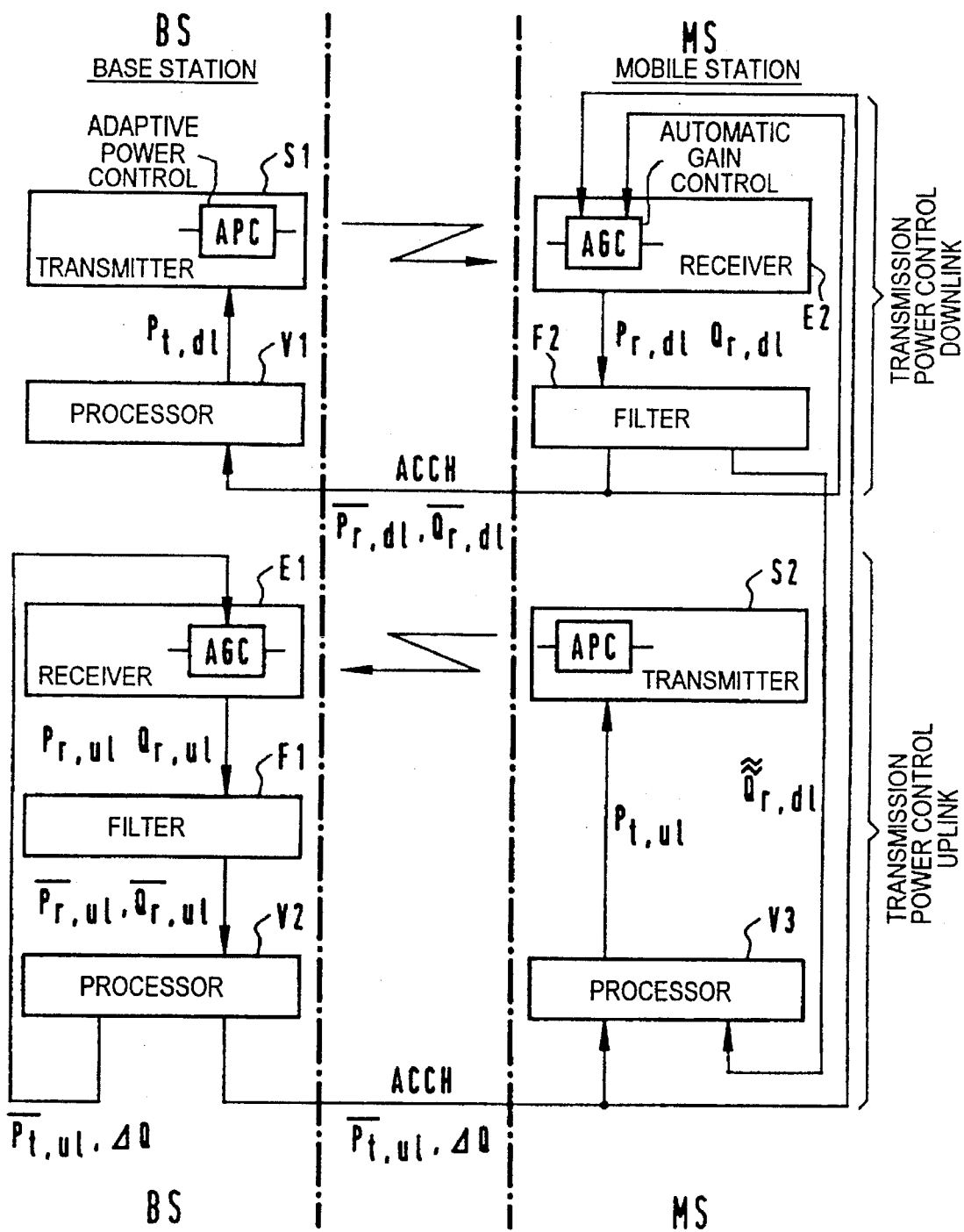
FIG. 3 depicts the collaboration of AGC and APC in a mobile radio telephone system having a base station and a mobile station, shown in a block circuit diagram.

In modern mobile radio telephone systems, special significance is accorded to the transmission power control in order to achieve optimum network capacity. This, on the one hand, makes the job of the AGC of the receiver of the partner station more difficult. On the other hand, the method of the present invention makes use of the fact that important information regarding this transmission power control algorithm is present that can be evaluated for an improved prediction of the received power to be anticipated. This involvement of the transmission power control of the one station and the variations to be anticipated as a result thereof in the prediction of the anticipated received power of the other station in shown in FIG. 2. The linkage of transmission power control and automatic gain control of the receiver are shown in this FIG. 2, as an addition to FIG. 1. For this purpose, an additional connection from the APC to the AGC is entered in every radio communication station. Most importantly, the prediction is based not only on values of the past but also co-involves the anticipated variations of the transmission power. A more reliable setting of the automatic gain control is thus achieved, this being reflected in lower demands made of the liberal design of the range of dynamics initially set forth. When, for example, the required word width of the analog-to-digital converter can be reduced by two bits, the manufacturing costs are reduced on the one hand and, on the other hand, an advance into fundamentally more advantageous realization possibilities may even be opened up under certain circumstances because of the increasing converter speeds related to decreasing word widths.

As an exemplary embodiment, FIG. 3 shows a mobile radio telephone system having a base station BS and a mobile station MS in a mutual spatial arrangement upon employment of a method for controlling the transmission power of a mobile station. Such a method for controlling the transmission power is disclosed in German patent application P 43 08 904.6.

The base station BS is shown at the left-hand side of FIG. 3 and the mobile station is shown at the right-hand thereof. A radio channel is located between the two. The base station BS contains a transmitter S, having an APC that is connected to a unit V1 for signal processing (algorithm for controlling the transmission power of a base station BS) that is in communication via an associated control channel (ACCH) with the output of a filter F2 at the receive side of the mobile station. The input of the filter F2 is connected to the receiver E2 of the mobile station MS, the receiver containing an AGC. At this level, the transmission power control for the downlink occurs, i.e. the control of the transmission power of the base station.

The base station BS also contains a receiver E1 having an AGC that is followed by a filter F1 and by a following signal processing V2 (algorithm for the control of the transmission power of a MS) what is a long-term control here. An output of the signal processing is then connected to the receiver input E1. Data of the transmission power control are communicated via this connection to the AGC in the receiver E1 for predicting the anticipated received power. A second output of V2 is connected via an associated control channel (ACCH) to a means V3 for signal processing (algorithm for control (short-term control here) of the transmission power of a MS) at the transmission side of the mobile station MS. A second input of the processor V3 is connected to a second output of the filter F2 following the receiver E2 of the mobile station, whereby the output of the processor V3 is connected to the transmitter S2 of the mobile station MS. Further, a connection is provided from the filter output F2 to the AGC in the receiver E2 of the mobile station and a connection is also provided via the control channel from the processor V2 of the base station BS to the AGC of the receiver E2 in the mobile station MS. Via these two connections, the AGC in the receiver E2 receives data from the transmission power controls for predicting the anticipated received power. The lower level in the illustration between transmitter S2 of the mobile station MS and receiver E1 of the base station BS contains the transmission power control for the uplink.

For a better understanding of the inventive method for optimizing the automatic amplifier setting in radio receivers, particularly mobile radio telephone receivers in a cellular mobile radio telephone network, the transmission power control incorporated into the method and as recited in the aforementioned patent application shall be set forth first with reference to FIG. 4.

In FIG. 4, the mobile station MS and the base station BS are each respectively shown by boxes drawn with broken lines, whereby the base station BS is shown at both sides of the mobile station MS for a clearer illustration of the control circuits. Radio channel 1 (downlink) lies between the base station BS and the mobile station MS and radio channel 2 (uplink) lies in the opposite transmission direction from the mobile station MS to the base station BS. The disturbances occurring on the radio channel are referenced $Z_{d1}$ or $Z_{u1}$ and are marked by an arrow directed onto the respective boxes 1 and 2.

The control of the long-term transmission power $\overline{P}_{t,u1}$ of the mobile station MS occurs in the base station on the basis of the following quantities: received power $P_{r,u1}$ filtered over N samples ($\hat{=}T1$) and reception quality $Q_{r,u1}$ filtered over N samples ($\hat{=}T1$) of the uplink, whereby the filtering (for example, averaging) occurs in filter 3 of the base station BS, as well as via the thresholds for these two quantities prescribed as O & M parameters. As upper and lower thresholds for received power and reception quality, these are forwarded to a second input of a subtraction element 10 whose output side is connected to a box 5 containing the long-term control algorithm and determination of the parameters for the short-term control. The identified values of the received power and reception quality at the output of the filter 3 can be subjected to yet another filtering, for example a sliding averaging over m values. This occurs in the filter 4 arranged in the connecting paths between filter output 3 and subtraction element 10 of the base station. The O & M parameter m is dependent, among other things, on the cell type and on the cell size.

In this method, a statement about the reciprocity of the radio channel is additionally made in the base station from the filtered results $\overline{P}_{r,u1}$ and $\overline{Q}_{r,u1}$ calculated by the base station itself, as well as from the data of the filtered reception values $\overline{P}_{r,d1}$ and $\overline{Q}_{r,d1}$ of the downlink communicated to it from the mobile station. This estimate of the reciprocity of the channel (identification) ensues in the means 6 arranged in the connecting path between filter 3 and means 5. The result of the estimate is supplied to the means 5 as reciprocity index and unmodified together with the long-term level $\overline{P}_{t,u1}$, is communicated as a prescription of the parameters for the short-term control of the mobile station MS which contains a means 7 for the short-term control algorithm, based upon restricted control range and long-term level.

In order to be able to control the transmission power $P_{t,u1}$ of the mobile station MS as true-to-reality as possible, a limited decision authorization is conferred on the mobile station MS. For a limitation of the signalling load connected therewith, the control of the lower level implemented in the mobile station is based on measurements of the downlink. For this purpose, the reception quality $Q_{r,d1}$ is filtered in the mobile station MS over N/K samples ($\hat{=}T2$). K is an O & M parameter that is upwardly limited by filtering out the fast fading, i.e., a minimum plurality of samples is required in order to filter out the fast fading and in order to reliably identify the slow fading. At the same time, K is a measure for the actuality of the control, i.e., the control occurs only according to the long-term value $\overline{P}_{t,u1}$ for K=1. The filtered output $\tilde{Q}_{r,d1}$ of the filter 8 is forwarded to an input of the means 7.

Since the mobile station is not aware of the global propagation situation, the identifier already discussed above is superimposed on the short-term control algorithm. The permissible direction and the maximum change of the short-term transmission power $P_{t,u1}$ being identified with this identifier. In addition, the permissible change direction and the maximally permissible amount can be made dependent on the type and amount of the last variation of $\overline{P}_{t,u1}$ as a further stabilizing factor.

The uplink wherein the mobile station is the transmitter and the base station is the receiver shall be considered first for further description of the method of the present invention. For control of its own transmission power as well as for the control of the transmission power of a mobile station allocated to it, the following data are known in the base station:

a) the filtered downlink reception level $\overline{P}_{r,d1}$ as well as the filtered downlink reception quality $\overline{Q}_{r,d1}$ (these data are communicated to the base station from the mobile station via an associated control channel ACCH);

b) the uplink reception level $P_{r,u1}$ as well as the uplink reception quality $Q_{r,u1}$ on the burst level;

c) the filtered uplink reception level $\overline{P}_{r,u1}$ as well as the filtered uplink reception quality $\overline{Q}_{r,u1}$;

d) the transmission power of the base station $P_{t,d1}$ to be set as a result of the control algorithm; and e) the long-term transmission power of the mobile station $\overline{P}_{t,u1}$ as well as a reciprocity index $\Delta Q$ as a result of the long-term control algorithm.

The base station thus has exact knowledge of the transmission channel available to it. Further, it also knows by what amount an in what direction the long-term transmission power of the mobile station will change at a specific point in time. In addition, the base station knows the self-control range of the mobile station. When the APC makes the information about the impending variations of the mobile station MS transmission power available to the AGC in the base station BS, then the latter is in the position to adjust its range of dynamics to these variations. Moreover, the range of dynamics can be made narrower.

In the downlink, the base station is the transmitter and the mobile station is the receiver. For any control of its own transmission power as well as for the control of the transmission of the allocated base station, the following data are known in the mobile station:

a) the downlink reception level $P_{r,d1}$ as well as the downlink reception quality $Q_{r,d1}$ on the burst level;

b) the filtered downlink reception level $\overline{P}_{r,d1}$ as well as the filtered downlink reception quality $\overline{Q}_{r,d1}$;

c) the long-term transmission power of the mobile station $\overline{P}_{t,u1}$ as well as a reciprocity index $\Delta Q$ as a result of the long-term control algorithm in the base station that are transmitted to the mobile station MS via an associated control channel (ACCH);

d) the targeted quality level of the radio link that is known from the radio link set-up procedure; and e) the transmission power of the mobile station $P_{t,u1}$ to be set as a result of the control algorithm.

Due to the investigation of the filtered downlink reception level $\overline{P}_{r,d1}$ as well as of the filtered downlink reception quality $\overline{Q}_{r,d1}$ and taking the targeted quality into consideration, the mobile station is in the position to recognize impending variations of the base station transmission power. The parameters of long-term transmission power of the mobile station $\overline{P}_{t,u1}$ and the reciprocity index $\Delta Q$ serve the purpose of making this perception more precise. The AGC in the mobile station can derive the amount of change from the variation of the current value of the long-term transmission power of the mobile station $\overline{P}_{t,u1}$ compared to the proceeding value as well as from the statement about the reciprocity between uplink and downlink. The AGC is thus in the position to set its range of dynamics to these variations and to make its range of dynamics narrower.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for optimizing an automatic amplifier setting in a radio receiver of a radio station, comprising the steps of: utilizing transmission power control of a transmitting radio station and of variations of the transmitted power thereof to be anticipated in a prediction of anticipated reception power of a receiving radio station that is in communication with said transmitting radio station; supplying this prediction to an automatic gain control of a receiver of this receiving radio station based on knowledge of data being used by the receiving radio station for controlling transmission power thereof.

2. The method according to claim 1, wherein data from the transmission power control of the transmitting radio station is transmitted to the receiving radio station for predicting anticipated reception power of the receiving radio station.

3. The method according to claim 1, wherein the prediction of the anticipated reception power ensues from combined use of mutual knowledge of each of the receiving radio stations of data utilized for control of the transmission power of each of the corresponding transmitting radio stations as well as for control of the transmission power with respect to an allocated, corresponding radio station.

4. The method according to claim 3, wherein the prediction of the anticipated reception power ensues from knowledge of data acquired or, respectively, calculated for control of a respective radio station's own transmission power or from knowledge of data acquired or, respectively, calculated for control of the transmission power of the respectively allocated corresponding radio station to the respective radio station.

5. The method according to claim 4, wherein the data for controlling the transmission power is acquired from a procedure for controlling transmission power of a mobile station in a mobile radio cellular network having a hierarchical control system composed of an upper level and a lower level;

said hierarchical control system providing on the upper level a closed loop transmission power control of the mobile station, said closed control loop containing the base station and the mobile station;

said hierarchical control system providing on the lower level an open loop transmission power control of the mobile station that is implemented in the mobile station;

said open transmission power control loop generating power control actions at a higher rate than the closed transmission power control loop, based on downlink measurements and additionally taking into account a reciprocity criterion, based on uplink and downlink measurements, utilized by the open control loop to determine the admissible range of short-term power control actions.

6. The method according to claim 1, wherein the radio receiver is a mobile radio telephone receiver in a cellular mobile telephone network having a base station in a spatial arrangement with mobile radio telephone receivers.

7. The method according to claim 3, wherein the transmitting radio station is a mobile station in an uplink of the data from the mobile station to the receiving radio station.

8. The method according to claim 3, wherein the transmitting radio station is a base station in a downlink of data from the base station to the receiving radio station.

9. A method for optimizing an automatic amplifier setting in a radio receiver of a radio station, comprising the steps of:

utilizing transmission power control of a transmitting radio station and of variations of transmitted power thereof to be anticipated in a prediction of anticipated reception power of a receiving radio station;

supplying the prediction to an automatic gain control of a receiver of the receiving radio station based on knowledge of data being used by the receiving radio station for controlling transmission power thereof, wherein the prediction of the anticipated reception power of the receiving station ensues from combined use of mutual knowledge of the receiving radio station of data for control of the transmission power of the transmitting radio station as well as for control of the transmission power with respect to one of a mobile station, in an uplink of the data from the mobile station to the respective radio station, and a base station, in a downlink of data from the base station to the respective radio station;

the prediction of the anticipated reception power ensuing from knowledge of data acquired, or respectively, calculated for control of the transmitting radio station's own transmission power or from knowledge of data acquired or, respectively, calculated for control of the transmission power of the receiving radio station and the data for controlling the transmission power is acquired from a procedure for controlling transmission power of a mobile station in a mobile radio cellular network establishing a hierarchical control system composed of an upper level and a lower level; said hierarchical control system providing on the upper level a closed loop transmission power control of the mobile station, said closed control loop having the base station and the mobile station; said hierarchical control system providing on the lower level an open loop transmission power control of the mobile station that is implemented in the mobile station;

said open transmission power control loop generating power control actions at a higher rate than the closed transmission power control loop, based on downlink measurements and additionally taking into account a reciprocity criterion, based on uplink and downlink measurements, utilized by the open control loop to determine the admissible range of short-term power control actions.

10. A method for optimizing an automatic amplifier setting in a radio receiver of a radio station, comprising the steps of: utilizing transmission power control, in a hierarchical control system having an upper level and a lower level, of a transmitting radio station and of variations of the transmitted power thereof to be anticipated in a prediction of anticipated reception power of a receiving radio station; supplying this prediction to an automatic gain control of a receiver of the receiving radio station based on knowledge of data of the transmission power control of the receiving radio station that is in communication with said transmitting radio station; and transmitting data indicative of transmission power control of the receiving radio station to the transmitting radio station for predicting anticipated reception power of the transmitting radio station.

11. The method according to claim 10, wherein the prediction of the anticipated reception power ensues from combined use of mutual knowledge of the receiving station of data for control of the transmitting power of the transmitting radio station as well as for control of the transmission power with respect to the receiving radio station.

12. The method according to claim 11, wherein the prediction of the anticipated reception power ensues from knowledge of data acquired or, respectively, calculated for control transmitting of the radio station's own transmission power or from knowledge of data acquired or, respectively, calculated for control of the transmission power of the receiving radio station.

13. The method according to claim 12, wherein the data for controlling the transmission power is acquired from a procedure for controlling transmission power of a mobile station in a mobile radio cellular network establishing a hierarchical control system composed of an upper level and a lower level; said hierarchical control system providing on the upper level a closed loop transmission power control of the mobile station, said closed control loop having the base station and the mobile station; said hierarchical control system providing on the lower level an open loop transmission power control of the mobile station that is implemented in the mobile station; said open transmission power control loop generating power control actions at a higher rate than the closed transmission power control loop, based on downlink measurements and additionally taking into account a reciprocity criterion, said criterion being based on uplink and downlink measurements, utilized by the open control loop to determine the admissible range of short-term power control actions.

* * * * *